(12) United States Patent
Marinet

(10) Patent No.: US 7,915,141 B2
(45) Date of Patent: Mar. 29, 2011

(54) DETERMINISTIC GENERATION OF AN INTEGRATED CIRCUIT IDENTIFICATION NUMBER

(75) Inventor: Fabrice Marinet, Chateauneuf le Rouge (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 12/559,682

(22) Filed: Sep. 15, 2009

(65) Prior Publication Data

US 2010/0003806 A1 Jan. 7, 2010

Related U.S. Application Data

(62) Division of application No. 11/234,861, filed on Sep. 23, 2005, now Pat. No. 7,608,932.

(30) Foreign Application Priority Data

Sep. 23, 2004 (FR) .................................. 04 52141

(51) Int. Cl.
*H01L 21/00* (2006.01)
(52) U.S. Cl. ........ 438/462; 438/113; 438/401; 438/975; 257/E21.523; 257/620; 257/797; 430/319
(58) Field of Classification Search ........... 257/E21.001, 257/E23.179, 734, 786, 797, 781, 758, 620, 257/E21.523; 438/460, 113, 130, 14, 401, 462, 975; 430/22, 311, 319
See application file for complete search history.

(56) References Cited

U.S. PATENT DOCUMENTS

| 4,388,386 | A | * | 6/1983 | King et al. .................... 430/5 |
|---|---|---|---|---|
| 4,446,475 | A | * | 5/1984 | Gercekci et al. ............. 257/48 |
| 5,017,514 | A | * | 5/1991 | Nishimoto .................. 438/14 |
| 5,262,258 | A | * | 11/1993 | Yanagisawa ................. 430/22 |
| 5,477,062 | A | * | 12/1995 | Natsume ..................... 257/48 |
| 5,800,951 | A | * | 9/1998 | Hashimoto .................. 430/5 |
| 5,923,047 | A | * | 7/1999 | Chia et al. ................... 257/48 |
| 6,365,443 | B1 | * | 4/2002 | Hagiwara et al. ............ 438/130 |
| 6,548,827 | B2 | | 4/2003 | Irie |
| 6,791,197 | B1 | * | 9/2004 | Katz ........................... 257/786 |
| 7,112,889 | B1 | | 9/2006 | Maruyama et al. |
| 2003/0049871 | A1 | | 3/2003 | Higashi |
| 2003/0094966 | A1 | * | 5/2003 | Fang .......................... 324/765 |
| 2006/0118972 | A1 | * | 6/2006 | Baek et al. .................. 257/786 |

* cited by examiner

*Primary Examiner* — Chris Chu
(74) *Attorney, Agent, or Firm* — Lisa K. Jorgenson; Kevin D. Jablonski; Graybeal Jackson LLP

(57) ABSTRACT

The generation of an identification number of a chip supporting at least one integrated circuit, including the step of causing a cutting of at least one conductive section by cutting of the chip among several first conductive sections parallel to one another and perpendicular to at least one edge of the chip, the first sections being individually connected, by at least one of their ends, to the chip, and exhibiting different lengths, the position of the cutting line with respect to the chip edge conditioning the identification number.

17 Claims, 2 Drawing Sheets

DETERMINISTIC GENERATION OF AN INTEGRATED CIRCUIT IDENTIFICATION NUMBER

PRIORITY CLAIM

The present application is a divisional of U.S. patent application Ser. No. 11/234,861, filed Sep. 23, 2005 now U.S. Pat. No. 7,608,932, which application claims priority from French patent application No. 04/52141, filed Sep. 23, 2004, which is incorporated herein by reference in its entirety.

BACKGROUND OF THE INVENTION

1. Field of the Invention

Embodiments of the present invention generally relate to the identification of integrated circuit chip(s) by means of a number which differentiates one chip from another with a degree of reproduction of the numbers.

Embodiments of the present invention more specifically relate to a deterministic determination of an identifier (identification number), that is, a voluntary generation of a selected number.

2. Discussion of the Related Art

Known methods for generating in deterministic fashion an integrated circuit chip identifier generally use a non-volatile memory of the circuit and store one number per writing into this memory.

This writing typically requires a specific step, be it on manufacturing (mask for writing into a ROM) or after manufacturing (electric or optical write process).

Furthermore, the storage of the identification number typically requires a memory area internal to the integrated circuit chip which takes up space.

SUMMARY OF THE INVENTION

An embodiment of the present invention aims at providing a method for generating and recording an integrated circuit chip identification number.

An embodiment of the present invention more specifically aims at enabling the generation with no specific dedicated step.

An embodiment of the present invention also aims at avoiding a non-volatile storage in active integrated circuits of the chip.

An embodiment of the present invention also aims at providing a deterministic generation, that is, the number of which is selected as it is generated.

An embodiment of the present invention also aims at providing a solution which is particularly simple to exploit in terms of reading of the generated number.

To achieve these and other objects, an embodiment of the present invention provides a method for generating an identification number of a chip supporting at least one integrated circuit, comprising the step of causing a cutting of at least one conductive section by cutting of the chip among several first conductive sections parallel to one another and perpendicular to at least one edge of the chip, the first sections being individually connected, by at least one of their ends, to the chip, and exhibiting different lengths, the position of the cutting line with respect to the chip edge conditioning the identifier.

According to an embodiment of the present invention, the minimum interval between two first sections is greater than the positioning tolerances of the cutting with respect to the chip.

According to an embodiment of the present invention, the first conductive sections are interconnected in the chip to a terminal of application of an excitation signal on a first one of their ends, their second respective ends providing bits of the identification number.

According to an embodiment of the present invention, the first conductive sections are connected to one another successively by perpendicular secondary sections, the lengths of the different first sections increasing from a first end of application of an excitation signal.

According to an embodiment of the present invention, the conductive section(s) are formed in at least one buried layer.

According to an embodiment of the present invention, the conductive section(s) are formed in at least one metallization level.

An embodiment of the present invention also provides an integrated circuit chip comprising, on at least one side, at least two conductive sections having two end terminals connected to the inside of the chip to generate an identification number thereof which depends on the position of a cutting line with respect to the corresponding edge of the chip.

According to an embodiment of the present invention, the chip comprises a circuit of excitation of the conductive path at one of its ends and of reading of the voltage at its other end.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION OF THE DRAWINGS

Figure 1:
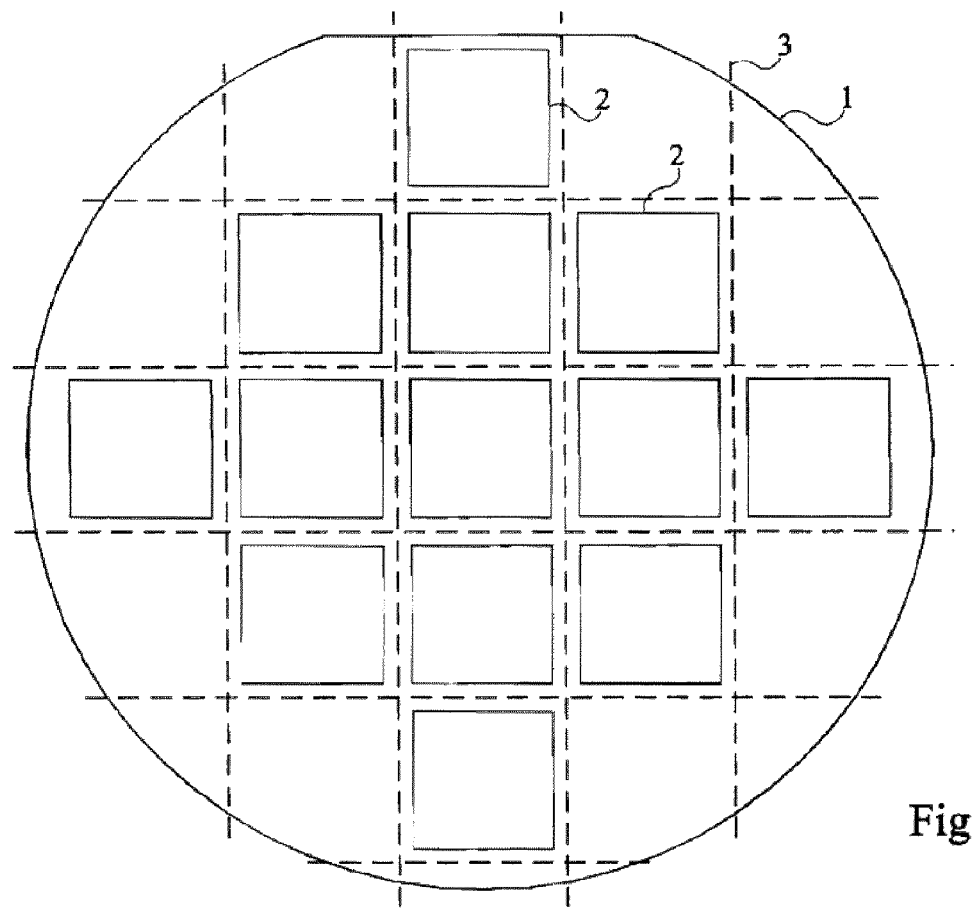
FIG. 1 is a simplified top view of a wafer on which integrated circuits have been manufactured.

Same elements have been designated with same reference numerals in the different drawings, which have been drawn out of scale. For clarity, only those elements that are useful to the understanding of embodiments of the present invention have been shown in the drawings and will be described hereafter. In particular, the exploitation made by the integrated circuit of the identifier, be it in recognition, ciphering, or other applications, has not been detailed, embodiments of the present invention being compatible with any conventional exploitation of an identifier stored in an integrated circuit chip.

A feature of an embodiment of the present invention is to generate an identifier of an integrated circuit chip on individualization thereof with respect to the other chips with which it is manufactured on an integrated circuit wafer.

FIG. 1 is a simplified top view of an integrated circuit wafer 1 on which several circuits or chips 2 have been formed. Arbitrarily, the circuits in FIG. 1 have been shown as square but any other integrated circuit shape may be appropriate for the present invention. Furthermore, it is assumed that identical circuits are formed on wafer 1, but the present invention also applies to the case where different chips are formed on the same wafer, provided that the cutting paths are respected, as will be shown hereafter. Furthermore, reference will be made to an integrated circuit chip, knowing that each chip may comprise one or several active and/or passive circuits.

At the end of the manufacturing, integrated circuit chips 2 are individualized by being cut (for example, by means of a saw) in paths 3 between chips 2. Embodiments of the present invention will be described hereafter in relation with a cutting with a saw, but is more generally compatible with any conventional integrated circuit cutting method.

A feature of an embodiment of the present invention is to provide, between chips, that is, in the cutting paths, several electrically conductive paths likely to be interrupted on cutting.

Figure 2:
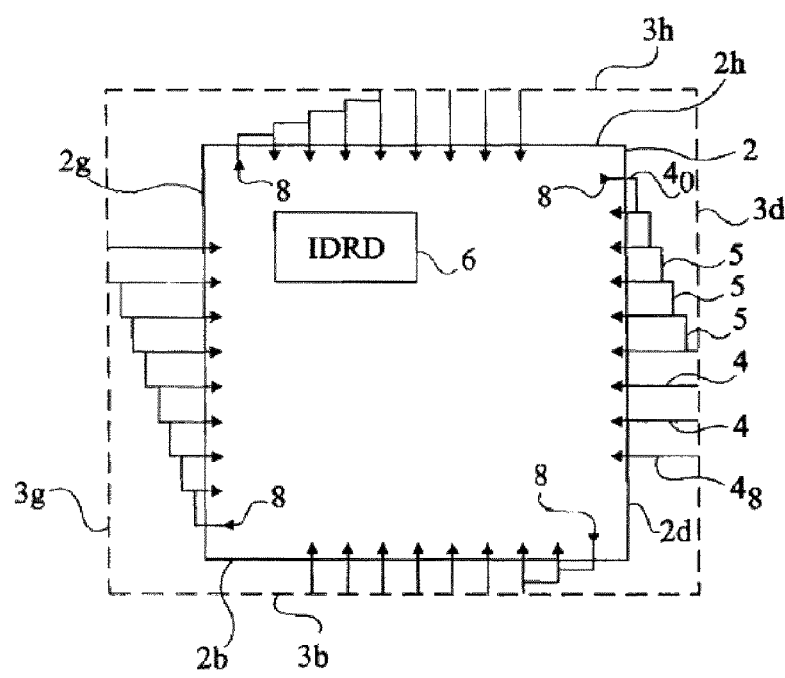
FIG. 2 is a detailed view of an integrated circuit chip of FIG. 1 showing means for generating and memorizing an identification number according to a first embodiment of the present invention.

FIG. 2 shows, in a very simplified top view, an integrated circuit chip 2 after cutting according to a first preferred embodiment of the present invention.

In this example, on manufacturing of integrated circuits 2 and in the cutting paths, several parallel conductive sections 4, perpendicular to edge 2g, 2h, 2d, or 2b of chip 2 to which they are respectively connected, are formed. Electric sections 4 of a same edge are further connected, at least by groups, successively to one another by means of conductive sections 5, perpendicular to sections 4.

According to an embodiment of the present invention, the respective positions of connection sections 5 with respect to the edge of the chip to which the corresponding sections 4 are connected are at different distances (increasing from a first section $4_0$ to a last section $4_8$).

In the integrated circuit chip cutting, the cutting line 3g, 3h, 3d, or 3b parallel to the concerned edge 2g, 2h, 2d, or 2b interrupts several sections 4 and, accordingly, suppresses one or several connections 5 to the sections of greater lengths.

This results in that, according to the position of cutting line 3 with respect to the chip edge, the number of conductive sections connected to one another by a perpendicular section 5 is different. It is then enough to excite, for example, by means of a D.C. voltage provided by a circuit 6 (IDRD) comprised in chip 2, end 8 of the shortest section $4_0$, and to measure the respective voltages at the ends of all the other sections of the same edge to obtain, directly in binary fashion, a word (here, over 8 bits) constitutive of the integrated circuit chip identifier. Chip 2 comprises means for exploiting (measuring and interpreting) the identifier, for example, contained in circuit 6.

Preferably, the same structure is reproduced on at least two sides, preferably on the four sides or more in the case of a non-parallelepiped chip. The obtained digital words are concatenated (as an alternative, combined). The reproduction of a same identification number is made less probable for a same integrated circuit wafer since, if two chips have the same number by one of the edges because they have been submitted to a same cutting line, it is enough to provide a different number on a cutting line in another direction so that the two chips do not have the same final identifier.

The elements provided on the different sides do not necessarily comprise the same number of sections (and thus of bits).

The positioning tolerances of cutting lines 3 in the paths on a wafer 1 are thus taken advantage of by embodiments of the present invention to individualize the chip identifiers with respect to one another. To enable predetermining the identification number, the length intervals between the different paths are selected according to the width of the cutting line (for example of the saw) and to its positioning tolerances. In practice, this amounts to providing a minimum interval between sections 5, towards sections 4, greater than the positioning tolerances of the cutting with respect to the chip edges. This condition enables guaranteeing the deterministic character of the identifier generation.

As a specific example, currently used saws may be designed for cutting paths (interval between two chips 2 of a same wafer 1) on the order of 100 μm and the cutting line (corresponding to the saw width) may have a thickness on the order of 20 to 25 μm. The tolerances in the saw alignment may be on the order of 5 μm, which imposes in this example a 10 μm interval e to differentiate the lengths of the conductive sections. As an alternative, saws of different thicknesses may be used.

The number of conductive paths generating and memorizing the identification numbers depends on the application, on the chip size, and on the size of the cutting paths.

It should be noted that, although a saw cutting line generally causes a scaling at the front surface of the chip, this scaling is not disturbing when provided to ranges within the cutting tolerances, which is in practice the case.

In the example of FIG. 2, assuming that the presence of a voltage is read as a state 1, side 2d of the chip provides a digital value 11111000. Side 2h of the chip provides a value 11110000. Left side 2g provides a value 11111110. Low side 2b provides a value 11000000.

Figure 3:
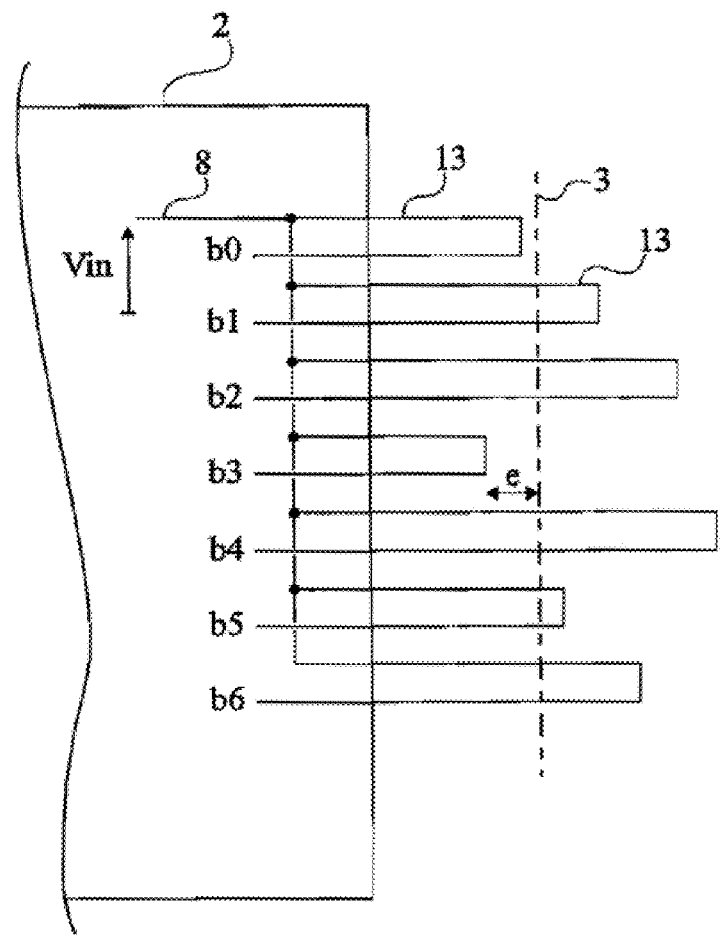
FIG. 3 is a partial top view of an integrated circuit chip illustrating the generation of an integrated circuit chip identification number according to a second embodiment of the present invention.

FIG. 3 shows a second embodiment of the present invention in which individual paths 13 are connected in parallel to a terminal 8 of application of an input voltage Vin, their other respective ends being individually readable by the read circuit 6 (FIG. 2) comprised in chip 2 and directly providing states zero or a component of the bits (in this example, b0 to b6) of the identification number.

Since sections 13 are individualized, it is not required, as in the first embodiment, for them to be of increasing length. In the embodiment of FIG. 3, the position of cutting line 3 interrupts some of the conductive sections which then provide first binary states (for example, zero) while the uninterrupted sections provide complementary states (for example, 1).

With this convention, the seven bits of the identification element of FIG. 3 provide value 1001000.

Figure 4:
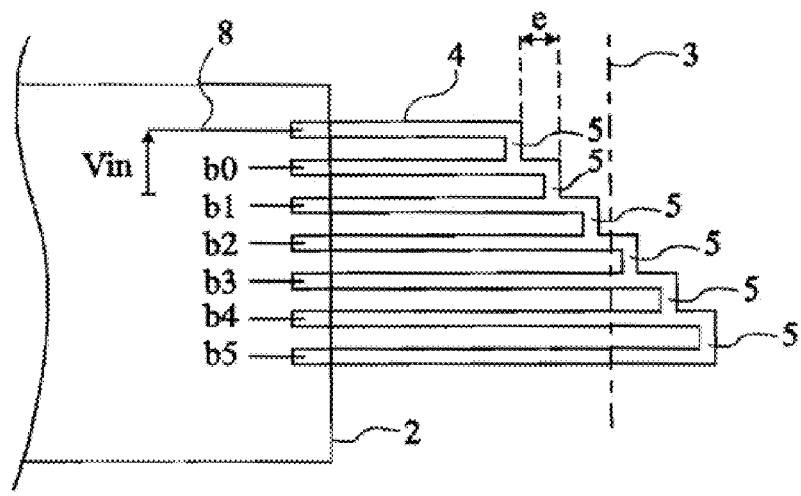
FIG. 4 illustrates in more detailed fashion a memorization element according to the first embodiment of the present invention.

FIG. 4 shows an enlarged view of conductive sections 4 of the first embodiment of FIG. 2, assuming that the element provides six bits b0 to b5. Conversely to the embodiment of FIG. 3, the cutting line does not individually condition the states but sets the rank of the word bit from which the state switches. In FIG. 4, a width of conductive sections 4 and 5 has been illustrated.

In this example, the six bits of the formed identification element provide value 111000.

An advantage of an embodiment of the present invention is that it enables generating in extremely simple fashion integrated circuit chip identification numbers.

Another advantage of an embodiment of the present invention is that the memorization of the identification number, generated at the end of the manufacturing by the chip cutting, is intrinsic to the chip and requires no active element. This number may, however, also be memorized in the chip.

Another advantage of an embodiment of the present invention is that the generation requires no dedicated manufacturing step, the forming of the conductive paths occurring at the same time as the chip connections in its conductive levels and the identifier generation and memorization being performed at the same time as the chip cutting.

Another advantage of an embodiment of the present invention is that the identifier reading is particularly simple (simple comparators or logic gates are sufficient).

The generation and memorization elements are not necessarily distributed over all the chip sides. They may be located on a portion of each edge of the cut chips.

The implementation of an embodiment of the present invention is compatible with the packaging subsequent to the cutting of an integrated circuit chip, with no specific precaution.

As an alternative, different paths may be provided in several conductive levels. An additional differentiation may then result from the cutting angle of the cutting tool if the angular tolerances are compatible.

The conductive sections may be formed in buried layers (active layers) or in upper metallization levels (interconnect levels). An advantage of buried layers is that they avoid the forming of splinters in the cutting as is the case for metal levels.

Although not shown in the figures, a pull-down resistor may be placed between ground and each of the conductive sections so that if a conductive section is cut, it will be grounded instead of floating.

Referring to FIGS. 1-4, the integrated circuit chip 2 may be part of a larger system such as a computer system.

Of course, embodiments of the present invention are likely to have various alterations, modifications, and improvements which will readily occur to those skilled in the art. In particular, the adaptation of the dimensions to be given to the conductive path(s) of generation of the identification number according to the chip sizes and to the tolerances of the used cutting tools is within the abilities of those skilled in the art based on the functional indications given hereabove. Furthermore, although embodiments of the present invention have been described in relation with conductive sections parallel and/or perpendicular to the chip edges to be parallel and/or perpendicular to the cutting lines, slantwise sections may be provided, provided that this slanting is compatible with a differentiation between several chips after the cutting. Moreover, the practical forming of a circuit 6 for exploiting the identification elements of an embodiment of the present invention by electric excitation and reading of the results uses conventional electronic components and is within the abilities of those skilled in the art according to the application.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A method for generating an identification number of a chip containing at least one integrated circuit, comprising: causing a cutting of at least one conductive section by cutting of the chip among several first conductive sections parallel to one another and perpendicular to at least one edge of the chip, the first conductive sections having first and second ends and each conductive section being connected, by at least one of ends respectively, to the chip, and exhibiting different lengths after the cutting, the position of the cutting line with respect to the chip edge conditioning the identifier.

2. The method of claim 1, wherein the minimum interval between two first conductive sections is greater than the positioning tolerances of the cutting with respect to the chip.

3. The method of claim 1, wherein the first conductive sections are interconnected in the chip to a terminal of application of an excitation signal on a first one of the ends respectively, each of the second respective ends providing bits of the identification number.

4. The method of claim 1, wherein the conductive sections are formed in at least one buried layer.

5. The method of claim 1, wherein the conductive sections are formed in at least one metallization level.

6. A method for generating an identification number of a chip containing at least one integrated circuit, comprising the steps of causing a cutting of at least one conductive section by cutting of the chip among several first conductive sections parallel to one another and perpendicular to at least one edge of the chip, the first conductive sections having first and second ends and each conductive section being connected, by at least one of ends respectively, to the chip, and exhibiting different lengths, the position of the cutting line with respect to the chip edge conditioning the identifier;

wherein the first conductive sections are connected to one another successively by perpendicular secondary sections, the lengths of the different first conductive sections increasing from a first end of application of an excitation signal.

7. A method of removing an integrated circuit die from a wafer, the die having conductor paths disposed on an edge of the die, the method comprising:

cutting adjacent to the edge of the die such that after cutting, each of the conductor paths has an open or a closed state wherein at least one conductive path has a closed state and at least one conductive path has an open state.

8. The method of claim 7, further comprising forming the die in a layer of the wafer.

9. The method of claim 7, further comprising generating an identification value as a function of the states.

10. The method of claim 9, wherein generating an identification value comprises providing an input voltage to each of the conductor paths.

11. The method of claim 9, further comprising storing the identification value.

12. A method of removing a die from a wafer, comprising:

cutting a wafer along a path at an edge of the die, the path having a plurality of conductive paths extending from the die, each conductive path having first and second ends electrical coupled to a circuit disposed on the die, the cutting interrupting at least one of the plurality of conductive paths and at least one conductive path remaining uninterrupted.

13. The method of claim 12 wherein each conductive path further comprises a first end that terminates within the circuit and a second end that terminates within the circuit such that the two ends have a conductive path the exudes into the path at the edge of the die.

14. The method of claim 12, further comprising causing an electrical signal to propagate in at least the conductive paths that remain uninterrupted such that an identification is generated based upon the number of uninterrupted paths.

15. The method of claim 12, further comprising causing an electrical signal to propagate in at least the conductive paths that remain uninterrupted such that an identification is generated based upon the pattern of uninterrupted paths.

16. The method of claim 12, further comprising causing an electrical signal to propagate in at least the conductive paths that remain uninterrupted such that an identification is generated based upon the configuration of uninterrupted paths.

17. The method of claim 12, further comprising causing an electrical signal to propagate in at least the conductive paths that remain uninterrupted such that an identification is generated based upon the number of interrupted paths.

* * * * *